(12) United States Patent
Inoue et al.

(10) Patent No.: US 8,130,123 B2
(45) Date of Patent: Mar. 6, 2012

(54) ROTARY ACTUATOR AND INPUT DEVICE USING THE SAME

(75) Inventors: Hiroto Inoue, Kyoto (JP); Tamotsu Yamamoto, Hyogo (JP)

(73) Assignee: Panasonic Corporation, Osaka (JP)

( * ) Notice: Subject to any disclaimer, the term of this patent is extended or adjusted under 35 U.S.C. 154(b) by 826 days.

(21) Appl. No.: 12/235,853

(22) Filed: Sep. 23, 2008

(65) Prior Publication Data

US 2009/0096641 A1 Apr. 16, 2009

(30) Foreign Application Priority Data

Oct. 15, 2007 (JP) ................................ 2007-267599

(51) Int. Cl.
*H03K 17/94* (2006.01)
*H03M 11/00* (2006.01)

(52) U.S. Cl. .......... 341/35; 345/163; 345/164; 345/165; 345/166; 345/167; 345/184; 324/207.25

(58) Field of Classification Search .................. None
See application file for complete search history.

(56) References Cited

U.S. PATENT DOCUMENTS

| | | | | |
|---|---|---|---|---|
| 5,669,485 A * | 9/1997 | Painter et al. | ................ | 200/308 |
| 5,963,195 A * | 10/1999 | Gregg et al. | ................ | 345/159 |
| 6,198,175 B1 * | 3/2001 | Kalb et al. | .................. | 307/10.1 |
| 6,297,795 B1 * | 10/2001 | Kato et al. | .................... | 345/684 |
| 6,534,730 B2 * | 3/2003 | Ohmoto et al. | .................... | 200/4 |
| 6,864,679 B2 * | 3/2005 | Yokoji et al. | .............. | 324/207.11 |
| 7,091,430 B1 * | 8/2006 | Haizima et al. | ................ | 200/6 A |
| 7,342,187 B2 * | 3/2008 | Yamaguchi | ....................... | 200/14 |
| 7,426,877 B2 * | 9/2008 | Ehrlich et al. | ........... | 73/862.328 |
| 7,462,787 B1 * | 12/2008 | Kang et al. | ........................ | 200/4 |
| 7,860,237 B2 * | 12/2010 | Takashima et al. | ....... | 379/433.06 |
| 7,872,202 B2 * | 1/2011 | Na et al. | ............................. | 200/4 |
| 7,910,843 B2 * | 3/2011 | Rothkopf et al. | ............. | 200/5 R |
| 7,991,149 B2 * | 8/2011 | Takashima et al. | ....... | 379/433.06 |
| 2002/0011402 A1 * | 1/2002 | Ohmoto et al. | .................... | 200/4 |
| 2003/0224737 A1 * | 12/2003 | Yokoji et al. | ................. | 455/90.3 |
| 2004/0233161 A1 * | 11/2004 | Shahoian et al. | ............. | 345/156 |
| 2007/0152657 A1 * | 7/2007 | Yabe et al. | ...................... | 324/174 |
| 2008/0211488 A1 * | 9/2008 | Kang | ........................ | 324/207.2 |

FOREIGN PATENT DOCUMENTS

JP 2005-302654 10/2005

* cited by examiner

*Primary Examiner* — Rexford N Barnie
*Assistant Examiner* — Justen Fauth
(74) *Attorney, Agent, or Firm* — Wenderoth, Lind & Ponack L.L.P.

(57) ABSTRACT

A rotary actuator includes a roller having a center shaft protruding along a center axis, a bearing for supporting the center shaft of the roller to allow the roller to rotate about the center axis, a ring magnet fixed to the center shaft of the roller, an elastic member having a ring shape provided between the center shaft of the roller and the bearing, and a fixed magnet facing the ring magnet. The ring magnet is alternately magnetized to an S-pole and an N-pole with predetermined angular intervals. This rotary actuator has a simple structure and operates with a preferable operation feeling.

20 Claims, 5 Drawing Sheets

ROTARY ACTUATOR AND INPUT DEVICE USING THE SAME

FIELD OF THE INVENTION

The present invention relates to a rotary actuator to be used for operating various electronic devices, and to an input device using the rotary actuator.

BACKGROUND OF THE INVENTION

As various electronic apparatuses, such as mobile phones and video cameras, have recently had small sizes and high functions, rotary actuators and input devices have been demanded to perform various operations of the apparatuses with a preferable feeling during operation.

FIGS. 4 and 5 are a front sectional view and an exploded perspective view of a conventional rotary actuator 6, respectively. Roller 1 has a substantially columnar shape and is made of metal or insulating resin. An outer circumferential surface of roller 1 has recesses. Roller 1 has center shafts 1A protruding from both ends of roller 1. Ring magnet 2 is alternately magnetized to S-poles and N-poles with predetermined angular pitches. Ring magnet 2 is fixed to each end of center shafts 1A of roller 1. Roller 1 is accommodated between upper cover 3 and lower cover 4 while center shafts 1A are rotatably supported by bearings 3A and 4A having substantially arcuate shapes. Plural fixed magnets 5 face ring magnets 2 by predetermined gaps provided at both ends of roller 1 with magnetic poles of ring magnet 2 and fixed magnet 5 having the same polarity face each other, thus providing rotary actuator 6.

FIG. 6 is side sectional view of input device 501 including rotary actuator 6. Plural wiring patterns are formed on upper and lower surfaces of wiring board 7. Wiring board 7 is located under rotary actuator 6. Magnetic detector 8, such as a Hall element, is mounted on the upper surface of wiring board 7. Magnetic detectors 8 face ring magnets 2 with predetermined gaps, thus providing input device 501.

Input device 501 is mounted to an operating section of an electronic device, such as a mobile phone, including a display, such as a liquid crystal display, and magnetic detector 8 is electrically connected to an electronic circuit of the electronic device via the wiring patterns.

An operation of input device 501 will be described below. While plural menus, such as names, or a cursor, are displayed on the display of the electronic device, roller 1 is rotated in left or right directions to rotate ring magnets 2. Since two ring magnets 2 are alternately magnetized to S-poles and N-poles deviating slightly from each other in angle by a predetermined angular phase difference, ring magnets 2 produce magnetic fields changing in different phases according to the rotation. Magnetic detectors 8 detect the change of the magnetic fields, generate pulse signals having phases different from each other, and send the signals to the electronic circuit of the electronic device.

The electronic circuit detects the direction and angle of the rotation of roller 1 based on the pulse signals, and moves the cursor on the menus on the display in vertical or horizontal directions, thereby allowing the menus, such as names, to be selected.

When roller 1 is rotated, this rotation produces attractive repulsive forces between ring magnet 2 and fixed magnet 5 facing each other. The attractive and repulsive forces provide generate click feeling, thus providing preferable, clear operation feeling.

Roller 1 rotates while center shaft 1A of roller 1 is supported by bearings 3A and 4A of upper cover 3 and lower cover 4, a friction produced between center shaft 1A and bearings 3A and 4A may cause a user to feel that roller 1 rubs.

Ring magnet 2 producing a larger magnetic field allows magnetic detector 8 to detect the direction and angle of the rotation of roller 1 more accurately, but also increases the attractive and repulsive forces between ring magnet 2 and fixed magnet 5. This may cause a rotation noise due to a shock when roller 1 is operated. Thus, conventional rotary actuator 6 can hardly operate with a preferable operation feeling.

BRIEF SUMMARY OF THE INVENTION

A rotary actuator includes a roller having a center shaft protruding along a center axis, a bearing for supporting the center shaft of the roller to allow the roller to rotate about the center axis, a ring magnet fixed to the center shaft of the roller, an elastic member having a ring shape provided between the center shaft of the roller and the bearing, and a fixed magnet facing the ring magnet. The ring magnet is alternately magnetized to an S-pole and an N-pole with predetermined angular intervals.

This rotary actuator has a simple structure and operates with a preferable operation feeling.

DETAILED DESCRIPTION OF THE INVENTION

Figure 1:
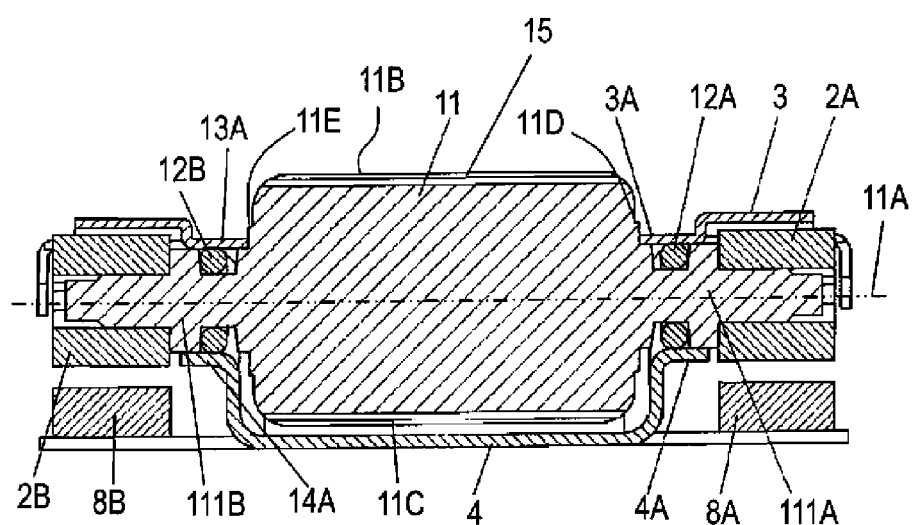
FIG. 1 is a front sectional view of a rotary actuator according to an exemplary embodiment of the present invention.
Figure 2:
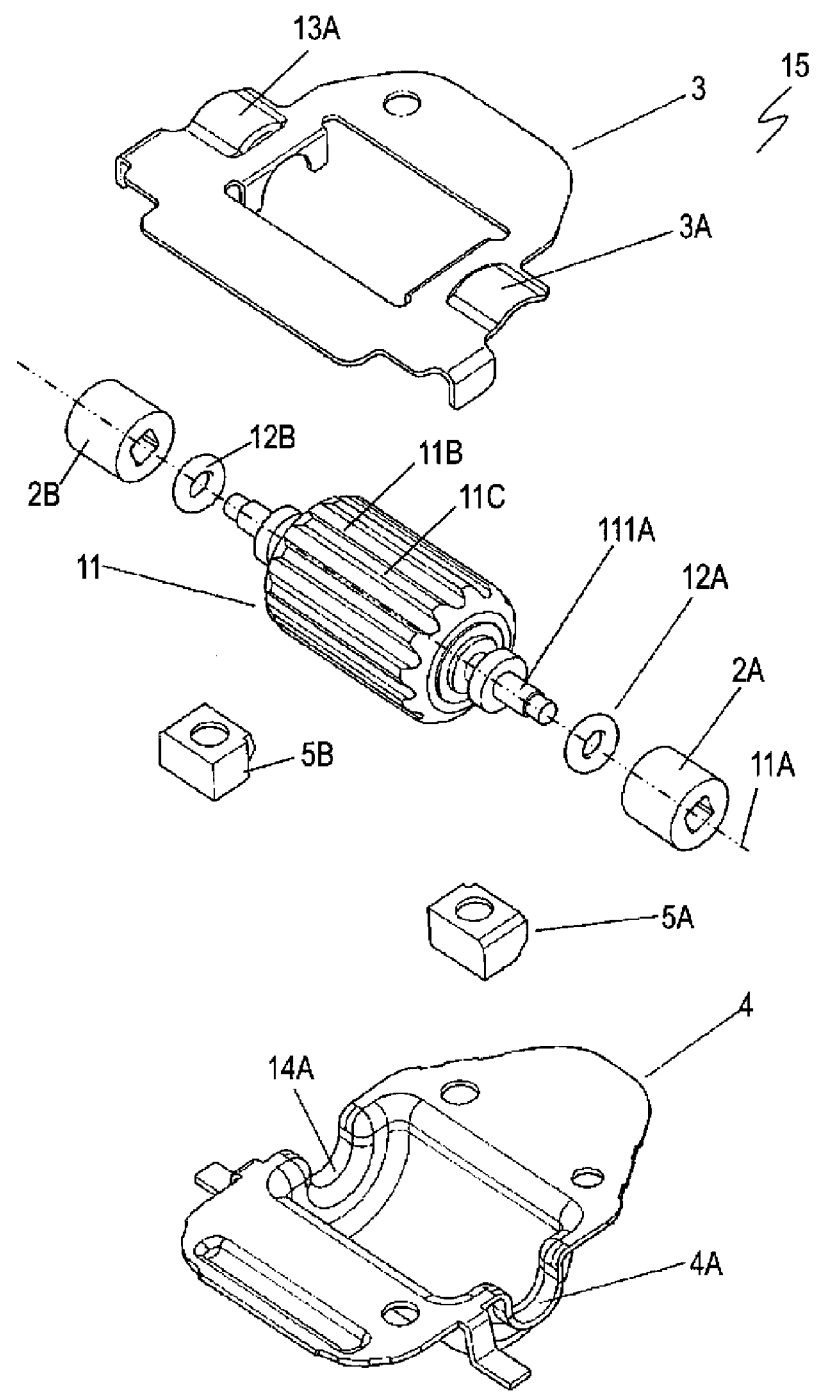
FIG. 2 is an exploded perspective view of the rotary actuator according to the embodiment.

FIGS. 1 and 2 are a front sectional view and an exploded perspective view of rotary actuator 15 according to an exemplary embodiment of the present invention, respectively. Roller 11 is made of metal, such as aluminum, or insulating resin and has substantially a columnar shape having center axis 11A. Grooves 11C extending in parallel to center axis 11A are provided in outer circumferential surface 11B of roller 11. Center shafts 111A and 111B protrude from end surfaces 11D and 11E along center axis 11A of roller 11, respectively.

Ring magnet 2A is alternately magnetized to S-poles and N-poles with predetermined angular intervals. Ring magnet 2B is alternately magnetized to S-poles and N-poles with angular intervals identical to those of ring magnet 2A. Ring magnets 2A and 2B are fixed to center shafts 111A and 111B, respectively, while the positions of the S-poles and the N-poles are deviated by a predetermined angular phase difference.

Upper cover 3 and lower cover 4 are made of metal, such as magnetic steel, to prevent leakage magnetic field. Center shaft 111A is rotatably supported by bearings 3A and 4A having substantially arcuate shapes. Center shaft 111B is rotatably supported by bearings 13A and 14A having arcuate shapes. Roller 11 is accommodated between upper cover 3 and lower cover 4 rotatably about center axis 11A. Bearings 3A and 4A surrounds center shaft 111A. Bearings 13A and 14A surrounds center shaft 111B.

Elastic members 12A and 12B made of elastic material, such as fluorine rubber, silicone rubber, urethane rubber, or elastomer, has substantially ring shapes. Elastic member 12A is mounted to center shaft 111A of roller 11, and has an outer circumferential surface thereof contacting bearings 3A and 4A of upper cover 3 and lower cover 4. Elastic member 12B is mounted to center shaft 111B of roller 11, and has an outer circumferential surface thereof contacting bearings 13A and 14A of upper cover 3 and lower cover 4. Elastic members 12A and 12B are made preferably of fluorine rubber to smoothly slide on bearings 3A, 4A, 13A, and 14A. Fluorine powders having a small powder diameter may be attached on surfaces of elastic members 12A and 12B. Elastic members 12A and 12B are immersed in solution including solvent and the fluorine powders dispersed therein. Then, elastic members 12A and 12B are taken out of the solution, and the solvent attached to the members is evaporated, thereby attaching the fluorine powders to elastic members 12A and 12B.

Fixed magnets 5A and 5B face ring magnets 2A and 2B with predetermined gaps in between, respectively, providing rotary actuator 15. Magnetic poles of fixed magnet 5A face magnetic poles of ring magnet 2A having polarities identical to polarities of magnetic poles of fixed magnet 5A. Magnetic poles of fixed magnet 5B face magnetic poles of ring magnet 2B having polarities identical to polarities of magnetic poles of fixed magnet 5B. The positions and shapes of fixed magnets 5A and 5B may be determined to stop roller 11 stably while an attractive force and a repulsive force produced between fixed magnets 5A and 5B and ring magnets 2A and 2B are balanced.

Figure 3:
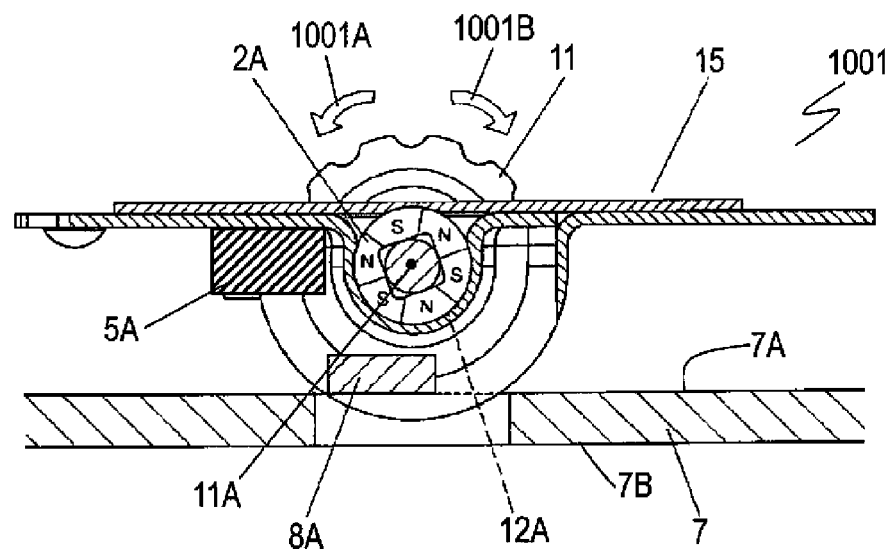
FIG. 3 is a side sectional view of an input device according to the embodiment.
Figure 4:
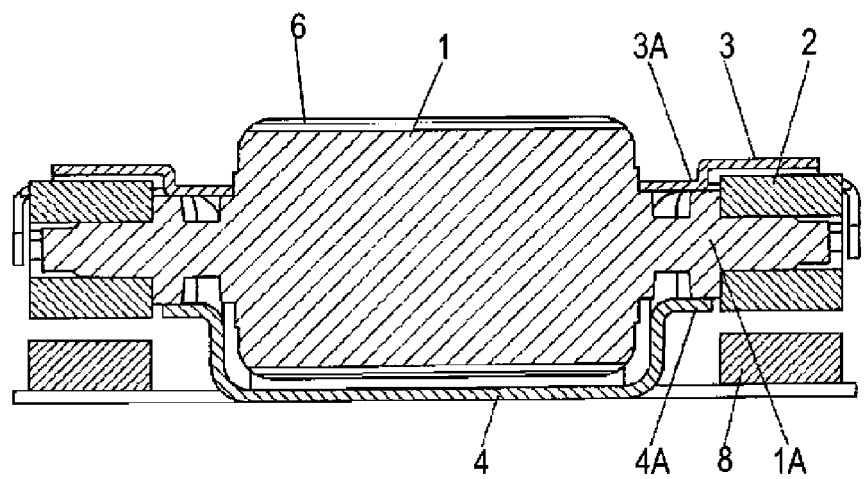
FIG. 4 is a front sectional view of a conventional rotary actuator.
Figure 5:
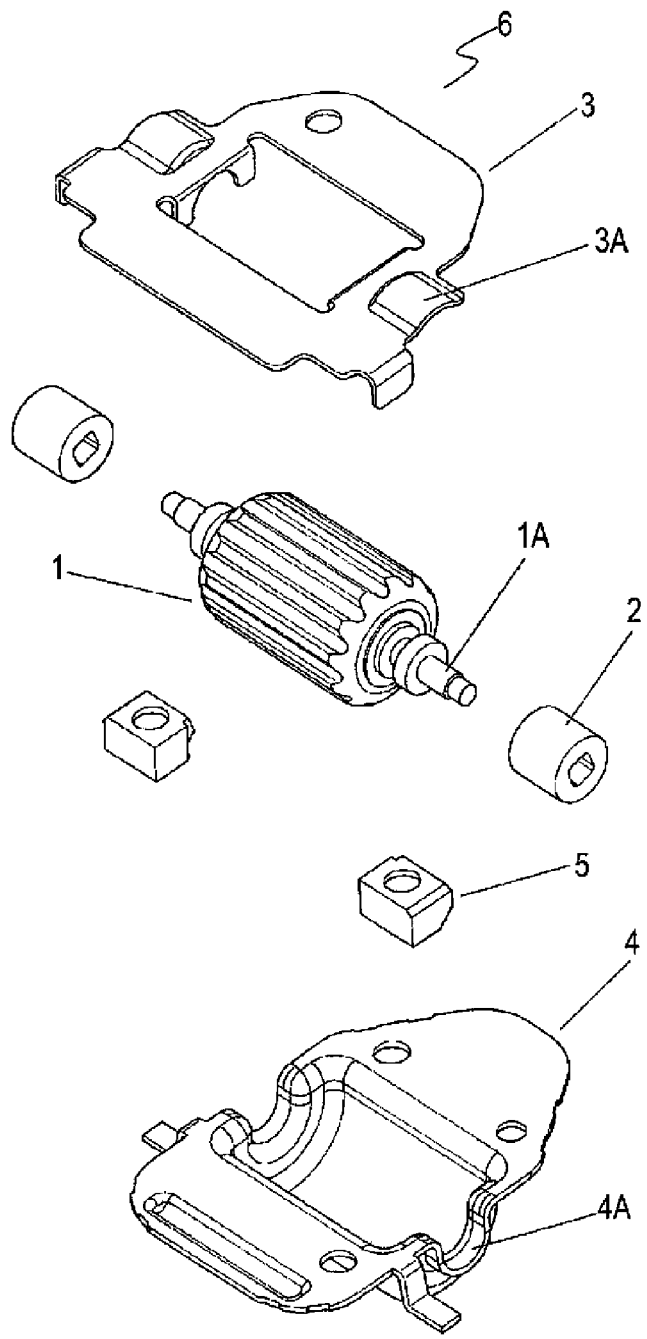
FIG. 5 is an exploded perspective view of the conventional rotary actuator.
Figure 6:
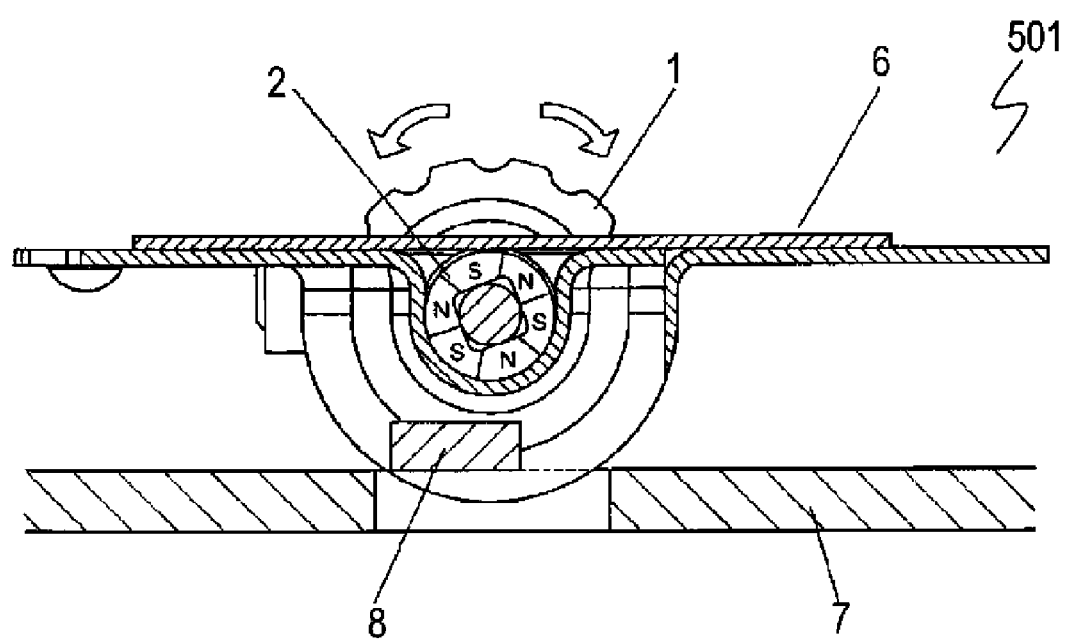
FIG. 6 is a side sectional view of an input device including the conventional rotary actuator.

FIG. 3 is a side sectional view of input device 1001 including rotary actuator 15. Wiring board 7 made of phenolic paper or glass epoxy has plural wiring patterns provided on upper surface 7A and lower surface 7B of wiring board 7 and is located under rotary actuator 15. Magnetic detectors 8A and 8B, such as Hall elements, are mounted onto upper surface 7A of wiring board 7. Magnetic detectors 8A and 8B face ring magnets 2A and 2B with predetermined gaps in between, respectively, providing input device 1001.

Input device 1001 is mounted to an operating section of an electronic device, such as a mobile phone, including a display, such as a liquid crystal display, and magnetic detectors 8A and 8B are electrically connected to an electronic circuit of the electronic device via the wiring patterns.

While plural menus, such as names, or a map, or a cursor or a pointer are displayed on the display, roller 11 is rotated in left direction 1001A or right direction 1001B about center axis 11A, and ring magnets 2A and 2B each of which is alternately magnetized to the S-poles and the N-poles are rotated, accordingly. Since ring magnets 2A and 2B are fixed by the predetermined angular phase difference and since each of magnets 2A and 2B is magnetized to the S-poles and the N-poles by an identical angular intervals, magnetic detectors 8A and 8B output pulse signals having phases different from each other to the electronic circuit of the electronic device according to the rotation of ring magnets 2A and 2B, i.e., roller 11.

The electronic circuit of the electronic device detects the direction and angle of the rotation of roller 11 based on the pulse signals, moves the cursor or pointer on the menus vertically or horizontally, thereby allowing a user to select the menus, such as the names, or the map.

When roller 11 is rotated, attractive and repulsive forces are generated between ring magnet 2A and fixed magnet 5A and between ring magnet 2B and fixed magnet 5B according to the rotation. These attractive and repulsive forces provide a preferable, clear operation feeling with a click feeling during the rotation of roller 11. When roller 11 stops, the attractive and repulsive forces between ring magnet 2A and fixed magnet 5A and between ring magnet 2B and fixed magnet 5B are balanced, thereby holding roller 11 stably.

In rotary actuator 15 according to this embodiment, ring magnets 2A and 2B are fixed to center shafts 111A and 111B of roller 11, respectively, while the magnetic poles of ring magnets 2A and 2B deviate by a predetermined angular phase difference. Magnetic detectors 8A and 8B output the pulse signals having phases different from each other. In another rotary actuator according to the embodiment, ring magnets 2A and 2B may be fixed to roller 11 while the magnetic poles of ring magnets 2A and 2B coincide with each other, and magnetic detectors 8A and 8B may be located at positions deviating with respect to ring magnets 2A and 2B, thereby outputting pulse signals having different from each other. For example, in the case that ring magnets 2A and 2B are magnetized to the S-poles and the N-poles with angular intervals of 60 degrees, one pulse is output at each rotation angle of 120 degrees. If magnetic detectors 8A and 8B are located at positions deviating by, for example, 30 degrees from each other with respect to ring magnets 2A and 2B, pulse signals having a phase difference of ¼ cycle, namely, 90 degrees, may be obtained. In still another rotary actuator according to this embodiment, ring magnets 2A and 2B are fixed to center shafts 111A and 111B of roller 11, respectively, while the magnetic poles of ring magnets 2A and 2B deviate by a predetermined angular phase difference, and magnetic detectors 8A and 8B are located at positions deviating with respect to ring magnets 2A and 2B, providing the same effects.

Roller 11 is rotated while center shafts 111A and 111B of roller 11 do not contact bearings 3A, 13A, 4A, and 14A of upper cover 3 and lower cover 4, elastic member 12A mounted to center shaft 111A contacts bearings 3A and 4A, and elastic member 12B mounted to center shaft 111B contacts bearings 13A and 14A. The outer circumferential surface of elastic member 12A having the ring shape elastically contacts bearings 3A and 4A, and an inner circumferential surface of elastic member 12A elastically contacts shaft 111A. Similarly, the outer circumferential surface of elastic member 12B having the ring shape elastically contacts bearings 13A and 14A, and an inner circumferential surface of elastic member 12B elastically contacts shaft 111A. Elastic forces with which the outer circumferential surfaces of elastic members 12A and 12B elastically contact bearings 3A, 4A, 13A, and 14 B are larger than elastic forces with which the inner circumferential surfaces of elastic members 12A and 12B elastically contact shafts 111A and 111B. This arrangement allows shafts 111A and 111B to slide on the inner circumferential surfaces of elastic members 12A and 12B, and prevents elastic members 12A and 12B from rubbing on bearings 3A, 4A, 13A, and 14A, while roller 11 is rotated.

The elastic members 12A and 12B prevent center shafts 111A and 111B from generating a rubbing feeling due to a friction produced when center shafts 111A and 111B contacts bearings 3A, 4A, 13A, and 14A. A simple structure, such as elastic members 12A and 12B allows a user to rotate roller 11 with a smooth, sticky comfortable sliding feeling.

Elastic members 12A and 12B prevent center shafts 111A and 111B from directly colliding with bearings 3A, 4A, 13A, and 14A due to the attractive and repulsive force generated between ring magnets 2A and 2B and fixed magnets 5A and 5B while roller 11 is rotated, and reduces a shock to reduce a rotation noise due to the shock.

What is claimed is:

1. A rotary actuator comprising:
a roller having a center axis, the roller having a first center shaft protruding along the center axis;
a first bearing surrounding the first center shaft for supporting the first center shaft of the roller to allow the roller to rotate about the center axis;
a first ring magnet fixed to the first center shaft of the roller, the first ring magnet being alternately magnetized to an S-pole and an N-pole with predetermined angular intervals;
a first elastic member provided between the first center shaft of the roller and the first bearing, the first elastic member having a ring shape which surrounds the first center shaft and which has a first inner circumferential surface and a first outer circumferential surface opposite to the first inner circumferential surface; and
a first fixed magnet facing the first ring magnet,
wherein the first inner circumferential surface of the first elastic member elastically contacts the first center shaft to urge the first center shaft toward the center axis, and
wherein the first outer circumferential surface of the first elastic member elastically contacts the first bearing to urge the first bearing away from the center axis.

2. The rotary actuator of claim 1, wherein the first center shaft is an integral portion of the roller and rotates with the roller, and wherein the first elastic member is disposed on the roller.

3. The rotary actuator of claim 1, wherein the first elastic member is made of fluorine rubber.

4. The rotary actuator of claim 3, further comprising fluorine powder attached on surfaces of the first elastic member contacting the first center shaft and the first bearing.

5. The rotary actuator of claim 1, wherein an elastic force with which the first elastic member elastically contacts the first bearing is larger than an elastic force with which the first elastic member elastically contacts the first center shaft.

6. The rotary actuator of claim 1, wherein the roller further has a second center shaft protruding along the center axis in a direction opposite to a direction in which the first center shaft protrudes, said rotary actuator further comprising:
a second bearing surrounding the second center shaft for supporting the second center shaft of the roller to allow the roller to rotate about the center axis; and
a second elastic member provided between the second center shaft of the roller and the second bearing, the second elastic member having a ring shape which surrounds the second center shaft and which has a second inner circumferential surface and a second outer circumferential surface opposite to the second inner circumferential surface,
wherein the second inner circumferential surface of the second elastic member elastically contacts the second center shaft to urge the second center shaft toward the center axis, and
wherein the second outer circumferential surface of the second elastic member elastically contacts the second bearing to urge the second bearing away from the center axis.

7. The rotary actuator of claim 6, wherein the second elastic member is made of fluorine rubber.

8. The rotary actuator of claim 7, further comprising fluorine powder attached on surfaces of the second elastic member contacting the second center shaft and the second bearing.

9. The rotary actuator of claim 6, further comprising:
a second ring magnet fixed to the second center shaft of the roller, the second ring magnet being alternately magnetized to an S-pole and an N-pole with predetermined angular intervals; and
a second fixed magnet facing the second ring magnet.

10. The rotary actuator of claim 1, wherein an elastic force with which the second elastic member elastically contacts the second bearing is larger than an elastic force with which the second elastic member elastically contacts the second center shaft.

11. An input device comprising:
a roller having a center axis, the roller having a first center shaft protruding along the center axis;
a first bearing surrounding the first center shaft for supporting the first center shaft of the roller to allow the roller to rotate about the center axis;
a first ring magnet fixed to the first center shaft of the roller, the first ring magnet being alternately magnetized to an S-pole and an N-pole with predetermined angular intervals;
a first elastic member provided between the first center shaft of the roller and the first bearing, the first elastic member having a ring shape which surrounds the first center shaft and which has a first inner circumferential surface and a first outer circumferential surface opposite to the first inner circumferential surface;
a first fixed magnet facing the first ring magnet, and
a magnetic detector facing the first ring magnet,
wherein the first inner circumferential surface of the first elastic member elastically contacts the first center shaft to urge the first center shaft toward the center axis, and
wherein the first outer circumferential surface of the first elastic member elastically contacts the first bearing to urge the first bearing away from the center axis.

12. The input device of claim 11, wherein the first elastic member is made of fluorine rubber.

13. The input device of claim 12, further comprising fluorine powder attached on surfaces of the first elastic member contacting the first center shaft and the first bearing.

14. The input device of claim 11, wherein an elastic force with which the first elastic member elastically contacts the first bearing is larger than an elastic force with which the first elastic member elastically contacts the first center shaft.

15. The input device of claim 11, wherein the roller further has a second center shaft protruding along the center axis in a direction opposite to a direction in which the first center shaft protrudes, said rotary actuator further comprising:
a second bearing surrounding the second center shaft for supporting the second center shaft of the roller to allow the roller to rotate about the center axis; and
a second elastic member provided between the second center shaft of the roller and the second bearing, the second elastic member having a ring shape which surrounds the second center shaft and which has a second inner circumferential surface and a second outer circumferential surface opposite to the second inner circumferential surface,
wherein the second inner circumferential surface of the second elastic member elastically contacts the second center shaft to urge the second center shaft toward the center axis, and
wherein the second outer circumferential surface of the second elastic member elastically contacts the second bearing to urge the second bearing away from the center axis.

16. The input device of claim 15, wherein the first center shaft is an integral portion of the roller and rotates with the roller, and wherein the first elastic member is disposed on the roller, and wherein the second center shaft is an integral portion of the roller and rotates with the roller, and wherein the second elastic member is disposed on the roller.

17. The input device of claim 15, wherein the second elastic member is made of fluorine rubber.

18. The input device of claim 17, further comprising fluorine powder attached on surfaces of the second elastic member contacting the second center shaft and the second bearing.

19. The input device of claim 15, further comprising:

a second ring magnet fixed to the second center shaft of the roller, the second ring magnet being alternately magnetized to an S-pole and an N-pole with predetermined angular intervals; and a second fixed magnet facing the second ring magnet.

20. The input device of claim 15, wherein an elastic force with which the second elastic member elastically contacts the second bearing is larger than an elastic force with which the second elastic member elastically contacts the second center shaft.

* * * * *